United States Patent [19]

Pulsipher et al.

[11] Patent Number: 5,087,842

[45] Date of Patent: Feb. 11, 1992

[54] DELAY CIRCUIT HAVING ONE OF A PLURALITY OF DELAY LINES WHICH MAY BE SELECTED TO PROVIDE AN OPERATION OF A RING OSCILLATOR

[75] Inventors: James A. Pulsipher; Robert H. Wolff; Steven G. Worthington, all of Colorado Springs, Colo.

[73] Assignee: Digital Equipment Corporation, Maynard, Mass.

[21] Appl. No.: 341,250

[22] Filed: Apr. 19, 1989

Related U.S. Application Data

[63] Continuation of Ser. No. 141,203, Jan. 6, 1988, abandoned.

[51] Int. Cl.⁵ .............................................. H03K 5/159
[52] U.S. Cl. .................................... 307/603; 307/605; 307/606; 307/597; 328/55; 328/66
[58] Field of Search ............... 307/602, 603, 605, 606, 307/595, 597, 591; 328/55, 56

[56] References Cited

U.S. PATENT DOCUMENTS

| | | | |
|---|---|---|---|
| 4,494,021 | 1/1985 | Bell et al. | 307/606 |
| 4,504,749 | 3/1985 | Yoshida | 307/602 |
| 4,623,805 | 11/1986 | Flora et al. | 307/606 |
| 4,626,716 | 12/1986 | Miki | 307/595 |
| 4,641,048 | 2/1987 | Pollock | 307/591 |
| 4,737,670 | 4/1988 | Chau | 307/602 |

Primary Examiner—Stanley D. Miller
Assistant Examiner—Trong Phan
Attorney, Agent, or Firm—Fish & Richardson

[57] ABSTRACT

The delay period of a delay circuit is maintained, over time, near to a desired delay, by generating information representative of the present delay period of the delay circuit, and altering the delay period, from time to time during operation, based on the present delay information and the desired delay. The present delay is measured by a reference circuit having a delay characteristic corresponding to the delay characteristic of the delay circuit. Both the reference and multiple delay circuits are formed with the same configuration on a single integrated circuit.

8 Claims, 3 Drawing Sheets

DELAY CIRCUIT HAVING ONE OF A PLURALITY OF DELAY LINES WHICH MAY BE SELECTED TO PROVIDE AN OPERATION OF A RING OSCILLATOR

This is a continuation of copending application Ser. No. 141,203 filed on Jan. 6, 1988 now abandoned.

BACKGROUND OF THE INVENTION

This invention relates to delay circuits.

A typical delay circuit delivers an output pulse at some predetermined delay time after receiving an input pulse. The predetermined delay period (between the input and output pulses) must be accurate and repeatable.

When a delay circuit is needed to provide a fixed specific delay period for logic located on an integrated circuit, a precision discrete delay circuit is typically provided in a separate package. Alternatively an RC-type delay circuit provided directly on a hybrid substrate may be adjusted at the time of manufacture (by laser trimming of resistors) to compensate for manufacturing variations in the delay characteristics of integrated circuit elements. Thus the delay period may nominally be set to the desired fixed delay. Typical delay lines do not permit variations of the delay amount to accommodate additional small changes in the delay characteristics that may occur during operation due to temperature and supply voltage changes.

Discrete delay circuits in which the delay period is selectable typically use tunable LC circuits or tapped delay lines feeding multiplexers.

SUMMARY OF THE INVENTION

The invention is a delay circuit configuration that maintains the delay period near to a desired delay despite manufacturing process, operating temperature, or supply voltage variations; it achieves this by generating information representative of the present delay period of the delay circuit, and altering the delay period, from time to time during operation, based on the present delay period and the desired fixed delay.

In preferred embodiments, a number of delay circuits of substantially the same configuration are formed on a single integrated circuit, and the delay measuring circuit includes a reference circuit also of the same configuration (and having a corresponding delay characteristic) formed on the same integrated circuit. Each delay circuit and the reference circuit is a serial delay line of elements; in the reference circuit the output of the final delay element (inverted) is routed to the input of the first delay element to form a ring oscillator. (The inverted output may be selectively disconnected to enable the ring oscillator to operate as a delay line.) The reference circuit delivers an output signal at a pin of the integrated circuit. A microprocessor located off the integrated circuit alters the delay characteristics of all of the delay circuits. The delay characteristic of the reference circuit is also altered. The delay characteristics are altered based on the frequency of the output signal.

In some embodiments, the delay period of the tunable delay circuit is variable voltage controllable. In that case, a digital to analog converter (which is formed as part of the integrated circuit) provides the variable voltage based on a digital word representing the desired duration of the delay period; and a register (for example, a serial-in, parallel out shift register) receives the word (e.g., serially) and delivers the word (e.g., in parallel) to the digital-to-analog converter. In other embodiments, the delay line includes taps between the delay elements; the taps are connected to a multiplexer, and the multiplexer is controlled by the control circuit to select one of the taps as the output of the delay circuit.

The invention allows for tight control of the delay period by providing compensation for integrated circuit processing, chip temperature, and chip voltage variations. It also eliminates the need for off-chip delay lines or pulse generators; reduces circuit space requirements, costs, and integrated circuit package pin counts (especially where many delays are needed); reduces the power dissipated by the integrated circuit (by eliminating the output drivers needed for off-chip delays; and increases integrated circuit reliability by reducing the component count, wire etches, and solder bonds.

Other advantages and features will become apparent from the following description of the preferred embodiment, and from the claims.

DESCRIPTION OF THE PREFERRED EMBODIMENT

We first briefly describe the drawings.

STRUCTURE AND OPERATION

Figure 1:
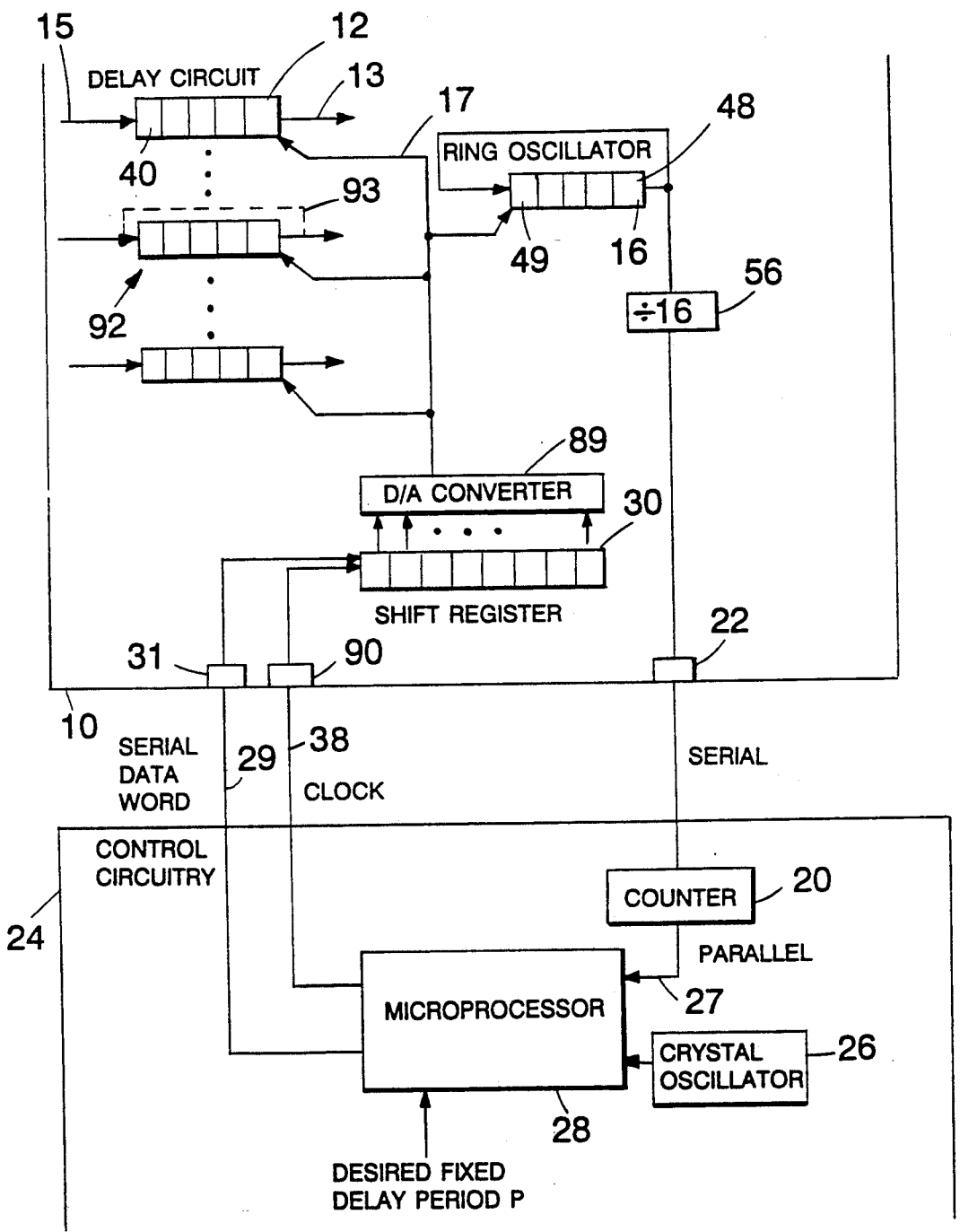
FIG. 1 is a diagram of a portion of an integrated circuit chip and associated off-chip circuitry.

Referring to FIG. 1, an integrated circuit chip 10 includes logic (not shown) that needs to use a number of delay circuits 12 (only three are shown), each of which is required to provide a pulse on an output line 13 at a time that represents a desired fixed delay period (e.g., 12 nanoseconds) following the receipt of a pulse on an input line 15. Each delay circuit 12 is a serial delay line having, e.g., a series of five identical tunable delay elements 40 designed such that, over the range of fabrication process variations and changes in operating temperature and supply voltage, each delay circuit can be maintained at a delay period of, e.g., 2.4 nanoseconds. Thus, the total delay of the five elements may be maintained 12 nanoseconds, as desired. Each delay element 40 in the delay circuit consists of two differential pairs which receive the input signal. One of the differential pairs is fabricated to pass the input signal rapidly; the other differential pair has been fabricated to pass the input signal more slowly. By varying the proportion of the signal passing through each differential pair, the desired time delay is achieved. As explained below, the proportion of the signal passed through each differential pair is voltage controlled. The outputs of a given delay element are connected to the inputs of the next delay element in the series.

The delay characteristics of the elements that make up delay circuits 12 depend on manufacturing process variations, and may also vary during operation in response to changing temperature and supply voltages. To assure that the delay period for each delay circuit 12 always has very nearly the desired delay characteristics, the delay period of each delay circuit 12 is tightly controllable, during operation, in accordance with a control voltage (for causing the desired delay period) received by the delay circuit on an input line 17 shared in common with the other delay circuits 12. The control voltage is adjusted until the actual present delay period (between an input pulse on line 15 and an output pulse on line 13) and the desired delay period.

A representative measure of the actual present delay period is generated by a ring oscillator 16 (also located on chip 10) which is essentially identical in its physical and electrical configuration to each delay circuit 12. (All of the delay circuits likewise have substantially identical physical and electrical configurations.)

In ring oscillator 16, the output of the final delay element 48 is fed back (inverted) to the inputs of the first delay element 49. This configuration causes continual oscillation in which a square wave (having a period of 24 nanoseconds) appears on the output of delay element 48.

Because oscillator 16 and the delay circuits are fabricated on the same chip 10 and in operation are subjected to the same temperature and supply voltage, their respective delay characteristics remain substantially identical with changing temperature and supply voltage. The output freguency of the ring oscillator 16 thus provides a measure representative of the actual present delay period of each delay circuit 12.

The ring oscillator output is divided by 16 in element 56 and then delivered serially to a pin 22 at a nominal rate of one cycle every 384 nanoseconds.

Figure 3:
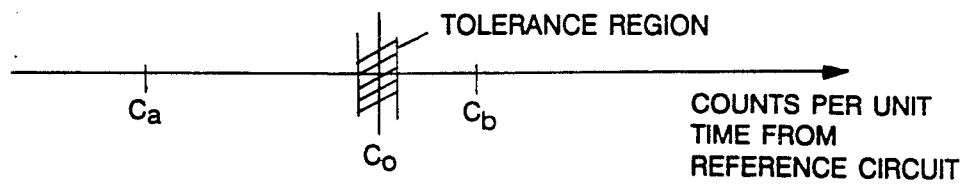
FIG. 3 is a diagram showing the interactive process of setting the delay period.

During calibration, the signal at pin 22 is counted by a counter 20 (part of off-chip control circuitry 24). The count in counter 20 is read by a microprocessor 28 over a parallel line 27. If one reading of counter 20 occurs at a time $t_0$, the next reading will be taken at a time $t_1$ where $t_1$ occurs a prespecified number of instruction cycles after $t_0$ (the instruction cycles are clocked by a crystal oscillator 26 so that a given number of instruction cycles translates into a specific time interval). The two counts read at $t_0$ and $t_1$ are subtracted to get an incremental count C. This will indicate the speed of the delay element. Because the period from $t_0$ to $t_1$ is fixed by the crystal oscillator, the desired fixed delay period p has been reached only when C is a predetermined value $C_0$. Whenever microprocessor 28 finds that the present C lies outside some tolerance region on either side of $C_0$, it causes the ring oscillator (and hence the delay circuits) to "home in" on $C_0$. Referring to FIG. 3, if $C_a$ is the first reading, then the microprocessor alters the ring oscillator speed to cause the next value, $C_b$, to be on the opposite side of $C_0$ with the magnitude of the difference) $(C_b-C_0)$ being half of the magnitude of the difference $(C_0-C_a)$.

Referring again to FIG. 1, microprocessor 28 causes the alteration of the delay period by serially issuing the bits of an 8-bit digital data word over a line 29 to a pin 31 on chip 10. Microprocessor 28 also issues clock signals over line 38 to a pin 90; the clock signals correspond to appearances of the bits of the serial data word on line 29. Pins 31, 90 are connected to an 8-bit, serial-in parallel-out shift register 30. The data word is loaded least significant bit first The parallel outputs of shift register 30 feed a digital-to-analog converter 89 whose output voltage is delivered on line 17 to the delay circuits and the ring oscillator.

The output of D/A converter 89 is a voltage at a level corresponding to the digital word received at pin 31. Shift register is initially loaded with binary 10 000 000 representing the middle of the speed range where 11 111 111 is the upper end and 00 000 000 is the lower end.

Thus, the arrangement of FIG. 1 is a technique for keeping the delay period of a delay circuit near to a desired value by providing a reference circuit (e.g., the ring oscillator 16) and controlling the delay period of the reference circuit by a feedback path in which information corresponding to the present delay period and desired delay are compared.

Figure 2:
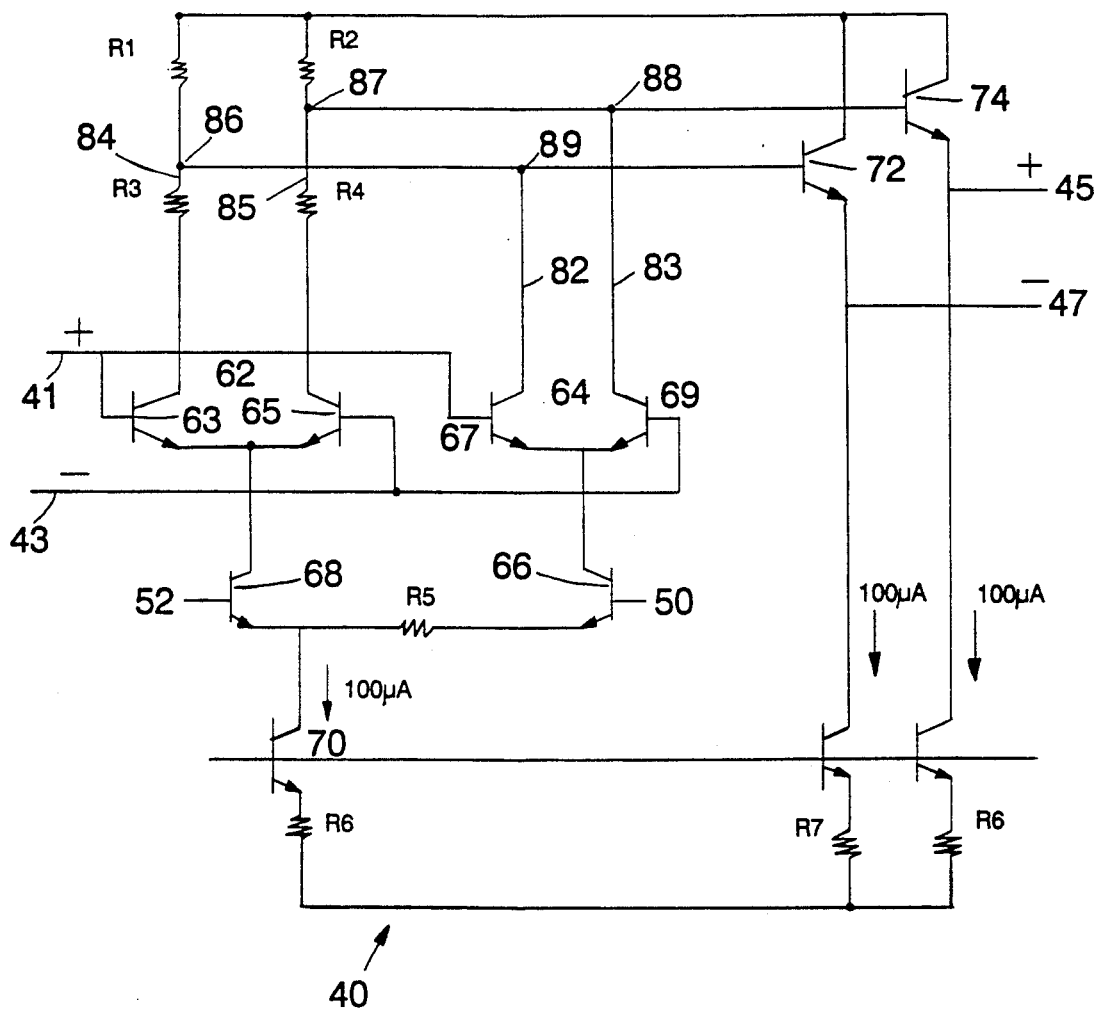
FIG. 2 is a schematic diagram of a voltage controlled delay element in a delay circuit of FIG. 2.

Referring to FIG. 2, an individual delay element 40 includes two differential transistor pairs 62, 64 that are both connected to receive the differential inputs 41, 43. The first differential pair 62 includes transistors 63, 65 which are fabricated as relatively massive regions on chip 10, thereby making them slow switching. The second differential pair 64 includes transistors 67, 69 which are fabricated as relatively smaller regions and are therefore relatively faster switching. The inputs 41, 43 are connected to the bases of the transistors as shown so that the appearance of a differential voltage on inputs 41, 43 will cause the transistors to switch. Differential pair 62 is controlled by transistor 68 which has the fixed voltage 52 input at its base. The second transistor pair 64 is controlled by transistor 66 which has the varying control voltage 50 input into its base. The emitters of transistors 68, 66 are connected to the collector of a transistor 70 which is a constant current source of 100 microamps. The control voltage 50 varies the proportion of the 100 microamps constant current that is passed via lines 82, 83 versus the proportion that is carried via lines 84, 85. The currents are summed by virtue of the connections at points 86, 87, 88, 89 This produces a circuit whose propogation time is effectively adjustable. Transistors 72, 74 are connected as emitter followers and provide a voltage shift and impedance matching for the output lines 45, 47. The resistors have the following values.

R1, R2—2K

R3, R4—7K

R5—10K

R6, R7, R8—4K (The specific circuit of FIG. 2 was the invention of others.)

All of the constant voltage inputs of all delay elements and the ring oscillator are connected in common; all of the control voltage inputs are likewise connected in common to input 17, FIG. 1.

Other embodiments are within the following claims.

For example, one of the delay circuits 92 (FIG. 1) could be provided with a controllable inverting connection (broken line 93) between its final delay element and its first delay element so that at times when it is not serving its normal delay circuit function, it temporarily may be reconfigured (by control circuit 24) as a ring oscillator, thus obviating the need for a separate ring oscillator 16.

Additional delay circuits having different nominal delay rates may also be included on the same chip. Multiplexing techniques may then be used to feed the control words to the chip and deliver the ring oscillator pulses from the chip.

Figure 4:
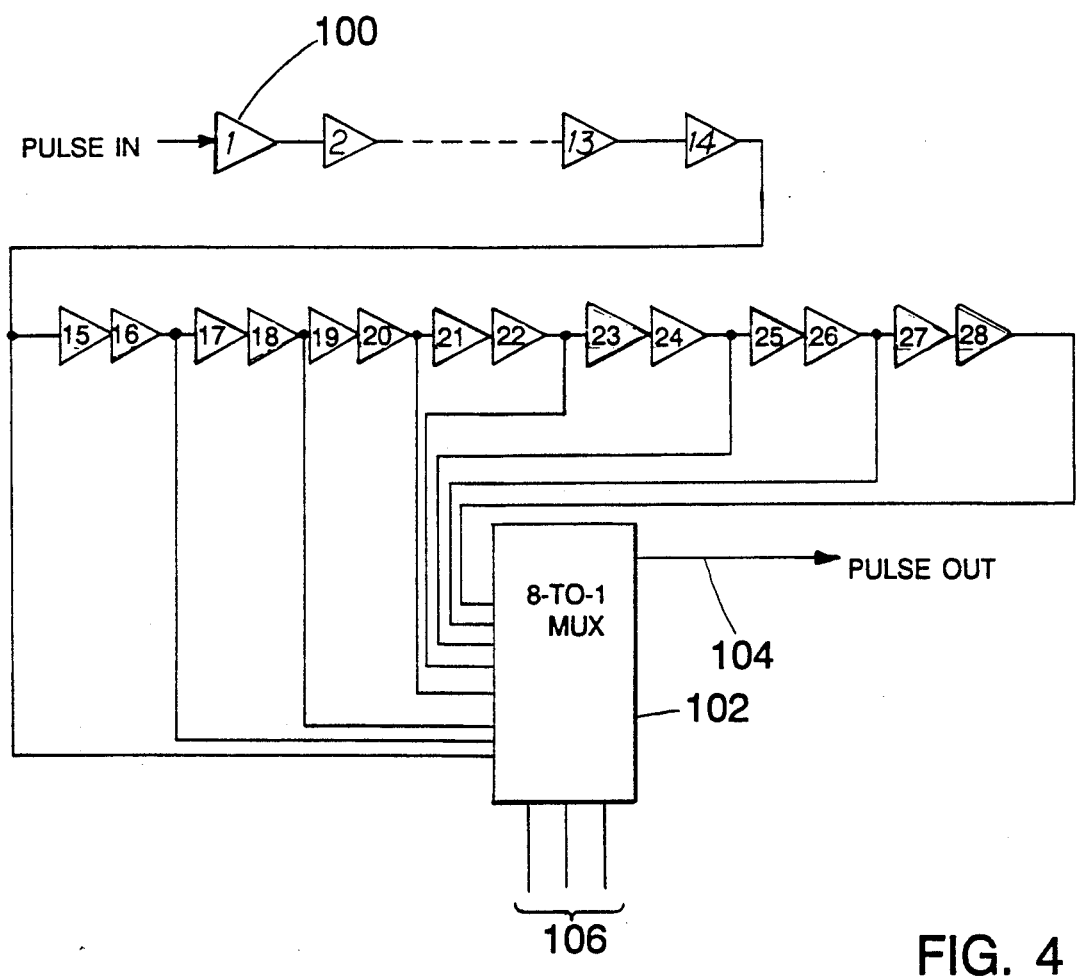
FIG. 4 is a block diagram of an alternative delay circuit.

Referring to FIG. 4, each delay circuit could be formed using a series of gates and a multiplexer.

Between the fourteenth and fifteenth, the sixteenth and seventeenth, and the eighteenth and nineteenth gates, and so on, are taps connected to the eight inputs of an 8-to-1 multiplexer 102. The choice of which tap will deliver the output pulse 104 is determined by a three-bit control value 106 delivered from control circuit 24.

The reference circuit would be the same except that the chosen tap would be latched for delivery to the control circuit and for recirculation to the first element in the delay circuit.

In all embodiments, the desired delay period could be a fixed value or could vary over time.

We claim:

1. Delay apparatus for receiving an input signal and providing a delayed version of the input signal, the actual delay between the input signal and the delayed version being controlled to remain near a desired delay, comprising:

an integrated circuit comprising:

a first voltage controlled delay circuit having an input line for receiving the input signal, an output line for generating the delayed version of the input signal, and a control input line for receiving a control voltage for controlling the length of the actual delay, a second voltage controlled delay circuit having the same physical and electrical configuration as the first delay circuit, the control input line of the second delay line being connected to the control input line of the first delay circuit, an inverter, connected between the output and the input of the second delay circuit to cause the second delay circuit to oscillate at a frequency determined by the delay period of the second delay circuit, buffer circuitry connected to the output of the second delay circuit for providing a periodic reference signal having a frequency representative of the frequency of oscillation of the second delay circuit, and conversion circuitry for receiving a digital value indicative of the desired delay and in response thereto providing a control voltage to the control input line of the first and second delay circuits; and off-ship control circuitry, separate from the integrated circuit, for receiving the periodic reference signal and in response thereto computing the digital value, and transmission circuitry for transmitting the digital value from the off-chip control circuit to the conversion circuitry.

2. The delay apparatus of claim 1 wherein the off-chip control circuitry receives a periodic reference signal from each of a plurality of oscillating delay circuits, and in response to each periodic signal, provides a corresponding digital value for maintaining the frequency of the periodic signal within a desired range.

3. The delay apparatus of claim 2 wherein the off-chip control circuit serially transmits each digital value to corresponding conversion circuitry.

4. The apparatus of claim 1 in which the inverter may selectively be disconnected from the second delay circuit to enable the second delay circuit to operate as a delay line.

5. The delay apparatus of claim 1 wherein the conversion circuitry includes a digital-to-analog converter whose output is the control voltage and whose input is the digital value indicative of the desired delay.

6. The delay apparatus of claim 5 wherein the conversion circuitry further includes a serial-in, parallel-out shift register for receiving the digital value serially from the off-chip control circuitry and delivering the digital value in parallel to the digital-to-analog converter.

7. The apparatus of claim 1 in which the off-chip control circuitry includes a counter to count the pulses of the received periodic reference signal.

8. Delay apparatus for receiving an input signal and providing a delayed version of the input signal, the actual delay between the input signal and the delayed version being controlled to remain near a desired delay, comprising:

an integrated circuit comprising:

a first voltage controlled delay circuit having an input line for receiving the input signal, an output line for generating the delayed version of the input signal, and a control input line for receiving a control voltage for controlling the length of the actual delay, a second voltage controlled delay circuit having the same physical and electrical configuration as the first delay circuit, the control input line of the second delay line being connected to the control input line of the first delay circuit, an inverter, connected between the output and the input of the second delay circuit to cause the second delay circuit to oscillate at a frequency determined by the delay period of the second delay circuit, circuitry for selectively disconnecting the inverter from the second delay circuit to enable the second delay circuit to operate as a delay line, buffer circuitry connected to the output of the second delay circuit for providing a periodic reference signal having a frequency representative of the frequency of oscillation of the second delay circuit, conversion circuitry for receiving a digital value indicative of the desired delay and in response thereto providing a control voltage to the control input line of the first and second delay circuits, said conversion circuitry including a digital-to-analog converter whose output is the control voltage and whose input is the digital value indicative of the desired delay, said conversion circuitry further including a serial-in, parallel-out shift register for receiving the digital value serially from the off-chip control circuitry and delivering the digital value in parallel to the digital-to-analog converter, and off-chip control circuitry, separate from the integrated circuit, for receiving the periodic reference signal and in response thereto computing the digital value, said off-chip control circuitry including a counter to count the pulses of the received periodic reference signal, and transmission circuitry for transmitting the digital value from the off-chip control circuit to the conversion circuitry.

* * * * *